United States Patent [19]
Ichimura et al.

[11] Patent Number: 5,999,347
[45] Date of Patent: Dec. 7, 1999

[54] METHOD AND APPARATUS FOR HIGHER RESOLUTION AUDIO SIGNAL TRANSMITTING

[75] Inventors: Gen Ichimura, Tokyo; Masayoshi Noguchi, Chiba; Yuichi Inomata, Tokyo; Masaaki Ueki, Tokyo; Makoto Yamada, Tokyo, all of Japan

[73] Assignee: Sony Corporation, Tokyo, Japan

[21] Appl. No.: 08/835,286

[22] Filed: Apr. 9, 1997

Related U.S. Application Data

[63] Continuation of application No. 08/267,569, Jun. 28, 1994, abandoned.

[30] Foreign Application Priority Data

Jun. 29, 1993 [JP] Japan ............................. P05-186947
Jul. 12, 1993 [JP] Japan ............................. P05-195371

[51] Int. Cl.$^6$ .............................. G11B 5/00; G11B 5/035
[52] U.S. Cl. ........................ 360/32; 360/65; 375/346; 375/350; 364/724.1
[58] Field of Search .................. 360/32, 30, 48, 360/19.1, 65; 375/103, 34, 285, 254, 346, 348, 350; 341/51, 61; 364/724.1

[56] References Cited

U.S. PATENT DOCUMENTS

| | | | |
|---|---|---|---|
| 4,130,806 | 12/1978 | Van Gerwen et al. | 375/350 |
| 4,318,086 | 3/1982 | Peek et al. | 340/347 |
| 4,481,546 | 11/1984 | Ito et al. | 360/30 |
| 4,614,936 | 9/1986 | Weidenbruch et al. | 340/347 |
| 4,668,988 | 5/1987 | Sasaki et al. | 358/166 |
| 4,692,737 | 9/1987 | Stikvoort et al. | 340/347 |
| 4,775,851 | 10/1988 | Borth | 341/155 |
| 4,811,396 | 3/1989 | Yatsuzuka | 381/30 |
| 4,831,464 | 5/1989 | Chijiiwa | 360/32 |
| 4,859,883 | 8/1989 | Bradinal | 307/546 |
| 5,115,240 | 5/1992 | Fujiwara et al. | 341/51 |
| 5,170,387 | 12/1992 | Groen | 360/32 |
| 5,216,712 | 6/1993 | Shimoda et al. | 360/60 X |
| 5,313,339 | 5/1994 | Fukami et al. | 360/19.1 |
| 5,351,154 | 9/1994 | Yoshioka et al. | 386/92 |
| 5,367,540 | 11/1994 | Kakuishi et al. | 375/103 |
| 5,384,669 | 1/1995 | Dunn et al. | 360/48 |
| 5,392,042 | 2/1995 | Pellon | 341/143 |
| 5,416,847 | 5/1995 | Boze | 381/94.3 |

FOREIGN PATENT DOCUMENTS

| | | | |
|---|---|---|---|
| 0119529 A2 | 9/1984 | European Pat. Off. | H04B 12/04 |
| 0168220 A2 | 1/1986 | European Pat. Off. | H03M 3/02 |
| 0271166 A3 | 6/1988 | European Pat. Off. | H03M 1/08 |
| 0271166 B1 | 3/1994 | European Pat. Off. | H03M 1/08 |

Primary Examiner—Aristotelis M. Psitos
Assistant Examiner—Regina Y. Neal
Attorney, Agent, or Firm—Limbach & Limbach LLP; Seong-Kun Oh

[57] ABSTRACT

A recording and/or reproducing apparatus for recording and/or reproducing digital audio signal on a recording medium such as a magnetic tape, which includes a recording and/or reproducing unit, an analog-to-digital convertor, a decimation filter, and noise shaper. The recording and/or reproducing unit records and/or reproduces signal on a recording medium at a speed double relative moving speed of a head and the recording medium at least. The analog-to-digital convertor converts input analog audio signal into digital signal with a sampling frequency which is above the audio frequency band, and sufficiently higher than the maximum frequency capable of recording by the recording and/or reproducing unit. The decimation filter reduces the sampling frequency of the digital signal output from the analog-to-digital convertor, and converts it into digital signal of m-bit (m>n). The noise shaper converts the digital signal from the decimation filter from m-bit to n-bit, and then in requantizing, shapes noise so as to suppress within the audio frequency band, and supplies it to the recording and/or reproducing unit.

26 Claims, 9 Drawing Sheets

METHOD AND APPARATUS FOR HIGHER RESOLUTION AUDIO SIGNAL TRANSMITTING

This is a continuation of application Ser. No. 08/267,569 filed on Jun. 28, 1994 which is now abandoned.

BACKGROUND

1. Field of the Invention

This invention relates to an audio signal transmitting apparatus and the method thereof, and more particularly to an improvement of an audio signal transmitting apparatus which is applicable to a recording and/or reproducing apparatus for recording and/or reproducing an audio signal on a recording medium.

2. Background of the Invention

A digital audio tape recorder generally converts an audio signal into a digital signal and records the signal on a magnetic tape to record and/or reproduce the audio signal with high tone quality.

This digital audio tape recorder samples audio signals input sequentially at a sampling frequency of 48 [kHz] or 44.1 [kHz], and performs analog-to-digital conversion to convert the audio signal into a 16-bit per sample digital signal.

A frequency of 20 [Hz] to 20 [kHz] is known to be the human audio frequency band in general. Accordingly, the digital audio tape recorder selects any of the above sampling frequencies so that the audio signal can be converted into a digital signal at a frequency band almost equal to the human audio frequency band.

The digital audio tape recorder divides the digital signal into specified blocks, adds an error correction code to each block, and interleaves the signal to generate record data.

The tape recorder uses this record data to drive a magnetic head to sequentially record the record data on a magnetic tape.

After converting, reproducing signal output from the magnetic head into binary data, the digital audio tape recorder performs a procedure which is the reverse of that performed in recording, so as to demodulate the original audio signal. Thereby, in the digital audio tape recorder, the deterioration of the tone quality can be effectively avoided in recording and reproducing.

In this type of digital audio tape recorder, a digital audio tape recorder (hereinafter referred to as "double-speed recording and reproducing digital audio tape recorder") has been proposed in which the rotating speed of a rotary drum is set to a value double the normal speed, and also the running speed of a magnetic tape is set to a value double the normal speed, so that an audio signal with a higher tone quality can be recorded and/or reproduced.

In this double-speed recording and/or reproducing digital audio tape recorder, the sampling frequency can be set to a value double the normal sampling frequency of the digital audio tape recorder, thus the recordable and reproducible frequency band can be increased to twice the width of the normal digital audio tape recorder.

Therefore, the double-speed recording and/or reproducing digital audio tape recorder can set the cutoff frequency of an antialiasing filter used to limit the band to a sufficiently higher frequency than the human audio frequency band, thereby, the deterioration of the transient characteristic within the audio frequency band can be substantially reduced compared with the normal digital audio tape recorder.

However, since the number of recordable and reproducible requantizing bits of the double-speed recording and/or reproducing digital audio tape recorder is the same as that of the normal digital audio tape recorder, the former tape recorder improves the frequency characteristic but fails to improve the amplitude characteristic compared to prior art.

If the characteristic of the double-speed recording and/or reproducing digital audio tape recorder can be used effectively and the amplitude characteristic can be improved easily, the tone quality and usability of the digital audio tape recorder may be further improved.

In the digital audio tape recorder which performs recording and/or reproducing at double-speed, a reproduced-data transfer rate is double that of the normal digital audio tape recorder, thus the time required for transfer is doubled if a digital audio interface compatible with digital audio signal is used to transfer reproduced data.

As a further disadvantage, reproduced audio data cannot be transmitted in real time even if the frequency characteristic is improved and the amplitude characteristic enhanced.

SUMMARY OF THE INVENTION

It is, therefore, an object of this invention to provide an audio signal transmitting apparatus which resolves the above-mentioned problem.

It is another object of the present invention to provide an audio signal transmitting method which resolves the above-mentioned problem.

It is further object of this invention to provide a recording and/or reproducing apparatus which resolves the above-mentioned problem.

According to this invention, there is provided an audio signal transmitting apparatus for transmitting a digital audio signal via a transmitting path which is constructed such that a digital signal having a predetermined number of bits is transmitted with a predetermined sampling frequency, the apparatus includes an analog-to-digital convertor, filter, and noise shaper. The analog-to-digital convertor converts an input analog signal into a digital signal having a sampling frequency above the audio frequency band. The filter reduces the sampling frequency of the digital signal output from the analog-to-digital convertor, and then converts it into a digital signal in which the number of bits is m-bits. The noise shaper reduces the number of bits of the digital signal from the filter from m-bits to n-bits, and supplies it to a transmitting path after requantization and suppression of the requantization noise within the audio frequency band.

According to this invention, there is provided an audio signal transmitting method. The transmitting method transmits a digital audio signal via a transmitting path which is constructed such that the transmitting digital signal having a predetermined number of bits per sample is transmitted with a predetermined sampling frequency. The sampling frequency is the frequency which can transmit the transmitting digital signal having a frequency band higher than the audio frequency band. The transmitting method is characterized in that: it requantizes digital audio signal having a larger number of bits than that of the transmitting path with the sampling frequency of the transmitting path, to generate transmitting digital signal, and then transmits the above transmitting digital signal via the transmitting path, and then executes noise-shaping so as to suppress the requantization noise within the audio frequency band, during requantization of the digital audio signal;

it band-limits the transmitting digital signal transmitted via the transmitting path within audio frequency band by the digital filter, and outputs it; and it converts the digital signal output from the digital filter into a predetermined sampling frequency by a sampling frequency conversion circuit, and outputs it.

According to this invention, there is provided an audio signal transmitting method. The transmitting method transmits digital audio signal via a transmitting path constructed such that the transmitting digital signal having a predetermined number of bits per sample is transmitted with a predetermined sampling frequency. The sampling frequency is the frequency which can transmit a digital signal having a frequency band above the audio frequency band. The transmitting method is characterized in that: it requantizes a digital audio signal having larger number of bits than that of the transmitting path with the sampling frequency of the transmitting path to generate transmitting digital signal; it transmits the above transmitting digital signal via the transmitting path in order to transmit the digital audio signal via the transmitting path; it generates the transmitting signal by noise-shaping so as to suppress the requantization noise in the audio frequency band, when the digital audio signal is requantized;

it band-limits the transmitting digital signal transmitted via the transmitting path in the audio frequency by a digital filter, and outputs it; and it converts the digital signal output from the digital filter into a predetermined sampling frequency by a sampling frequency converting circuit, and outputs it.

According to this invention, there is provided a recording and/or reproducing apparatus for recording and/or reproducing digital audio signal for a recording medium, including a recording and/or reproducing unit, analog-to-digital convertor, filter, and noise shaper. The recording and/or reproducing unit records and/or reproduces a signal at a speed double the normal relative moving speed of a head and a recording medium. The analog-to-digital convertor converts an input analog audio signal into a digital signal, which is above audio frequency band, and has sampling frequency selected to be sufficiently higher than the maximum frequency capable of recording by the recording and/or reproducing unit. The filter reduces the sampling frequency of digital data output from the analog-to-digital convertor, and converts it into a digital signal having m-bits (m>n). The noise shaper converts the digital signal from the filter into a digital signal reduced from m-bits to n-bits, and in requantization, noise-shapes it so as to suppress the quantization noise to within the audio frequency band and supplies it to the recording and/or reproducing unit.

According to this invention, when the digital audio signal is requantized to transmit, or record and/or reproduce it, the digital audio signal is noise-shaped so as to suppress the requantization noise within the audio frequency band, so that the quantization noise within the audio frequency band can be sent away out of the audio frequency band. Thereby, an apparatus for recording and/or a reproducing to/from a recording medium can be realized, in which a resolution higher than usually provided with a given number of bits per sample of the digital signal is transmitted or recorded and/or reproduced within audio frequency band, can be obtained in the auditory sense.

Further, according to this invention, the digital signal, which is transmitted or recorded and/or reproduced after noise-shaping is performed so as to suppress the requantization noise within the audio frequency band, is band-limited within the audio frequency band, and then has its sampling frequency converted and is output, so that an audio signal transmitting apparatus or an apparatus for recording and/or reproducing to/from a recording can be realized, in which the digital signal which is transmitted or recorded and/or reproduced by effectively utilizing the characteristic of the transmitting path or the recording medium, can be output in real time via a predetermined interface without deteriorating its quality.

The nature, principle and utility of the invention will become more apparent from the following detailed description when read in conjunction with the accompanying drawings in which like parts are designated by like reference numerals or characters.

DETAILED DESCRIPTION OF THE EMBODIMENT

A preferred audio signal transmitting apparatus according to the present invention will be described in detail with reference to the accompanying drawings:

In the embodiments described below, as an example, a digital audio tape recorder in which a magnetic tape is used as a recording medium, will be described as the audio signal transmitting apparatus.

Figure 1:
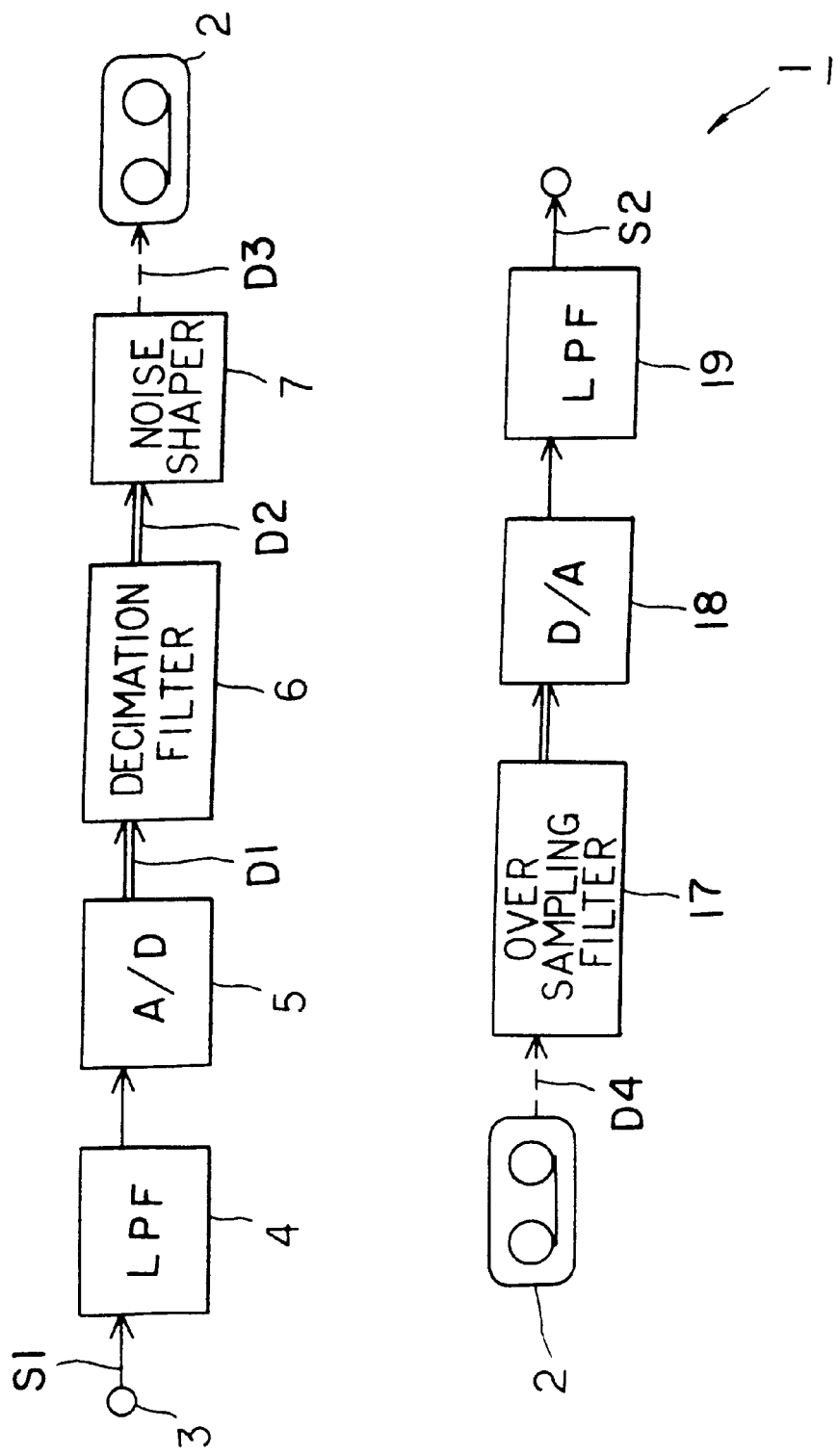
FIG. 1 is a block diagram illustrating a digital audio tape recorder according to a first embodiment of this invention.

In FIG. 1, a reference numeral 1 generally denotes a digital audio tape recorder. The digital audio tape recorder 1 uses a double-speed recording and/or reproducing digital audio tape recorder unit (hereinafter, referred to as "recorder unit") 2 to record analog audio signal S1 and reproduce the recorded analog audio signal S2.

The digital audio tape recorder 1 inputs the analog audio signal Si to a low-pass filter (hereinafter, referred to as "LPF") 4 via an input terminal 3. The LPF 4 performs band limitation using a frequency band double that of the normal digital audio tape recorder and outputs the filtered signal.

The digital audio tape recorder 1 supplies the output signal of the LPF 4 to an analog-to-digital converting circuit 5 to convert the signal into a digital signal.

According to a first embodiment, the recorder unit 2 records and/or reproduces digital audio signal with a sampling frequency 2 fs (2 fs=96 [kHz]). The sampling frequency of the analog-to-digital converting circuit 5 is selected to be 32 times as high as the sampling frequency of the recorder unit 2, that is, if the sampling frequency of a normal digital audio tape recorder is represented as "fs", the sampling frequency of this recorder unit 2 will be 64 fs).

According to the above, the digital audio tape recorder 1 selects a sampling frequency sufficiently higher than the maximum frequency of the audio frequency band as well as the maximum frequency of the recorder unit 2 to effectively avoid deterioration of the audio signal.

Digital signal D1 of the analog-to-digital converting circuit 5 is supplied to a decimation filter 6. The decimation filter 6 reduces the frequency of the digital signal D1, and increases the number of bits per sample of supplied digital signal D1. The decimation filter 6 converts the digital signal D1 into digital signal D2 with a sampling frequency of 2 fs as well as 20 bits per sample.

The decimation filter 6 reduces the frequency band of the digital signal D1 to a frequency band which can be recorded by the recorder unit 2.

The use of the recorder unit 2 for double-speed recording and/or reproducing, allows a digital audio signal with a sampling frequency 2 fs (=96 [kHz]) as well as 16 bits per sample to be recorded and reproduced to increase a recordable and reproducible frequency band double that of the normal digital audio tape recorder. Note that, the recorder unit 2 uses a tape cassette the same as the normal digital audio tape recorder, thus which comprises a rotary drum, a tape loading mechanism for loading and unloading a tape into the rotary drum, and a cassette loading mechanism etc.

The digital signal D2 output from the decimation filter 6 is supplied to a noise shaper 7. In the noise shaper 7, the number of bits per sample of the supplied digital signal D2 is reduced to 16 bits.

Thereby, in the digital audio tape recorder 1, the digital signal D3 output from the noise shaper 7 is supplied and recorded by the recorder unit 2. In the digital audio tape recorder 1, the digital signal D3 based on the audio signal S1 has a frequency band twice that which can be recorded by a normal digital audio tape recorder on the magnetic tape.

In the first invention, a noise shaping method is applied to improve aural resolution when the number of bits of the digital signal D2 is reduced by the noise shaper 7.

Figure 2:
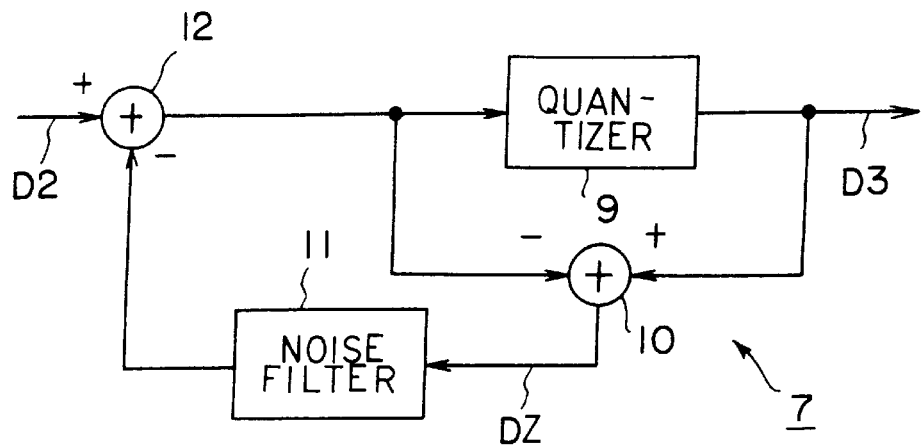
FIG. 2 is a block diagram illustrating the configuration of a noise shaper.

As shown in FIG. 2, in the noise shaper 7, the digital signal D2 which is input sequentially from the decimation filter 6 is input to a quantizer 9. In the quantizer 9, the digital signal D2 is requantized to convert it into the digital signal D3. As a result, the input digital signal D2 of 20-bits per sample is converted into the digital signal D3 of 16-bits per sample.

In the noise shaper 7, quantized error data DZ generated during requantization in the quantizer 9 is detected by a subtracting circuit 10, and the error data DZ is supplied to a subtracting circuit 12 via a noise filter 11.

Further, in the noise shaper 7, the error data DZ is subtracted from the input digital signal D2 at the subtracting circuit 12, so as to set quantization noises generated during requantization in the quantizer 9 to have a characteristic depending upon the frequency characteristic of the noise filter 11.

Figure 3:
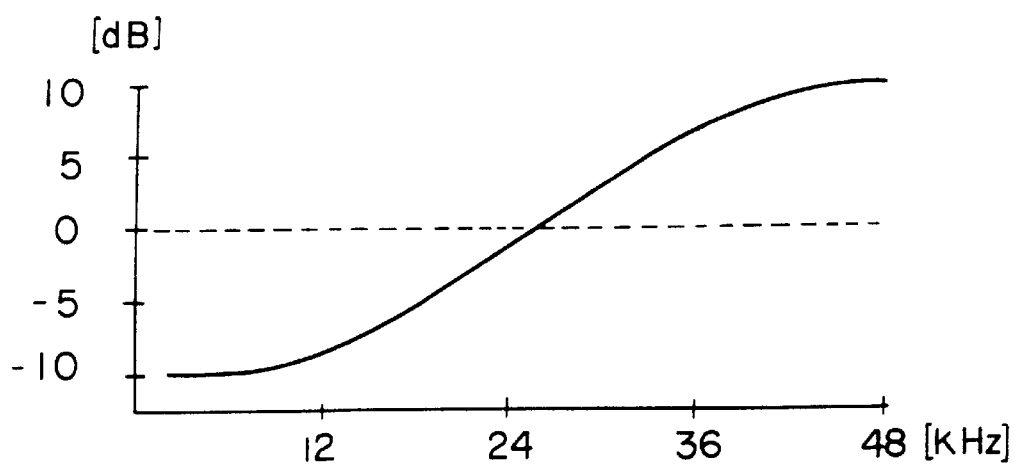
FIG. 3 is a characteristic curve diagram illustrating the frequency characteristic of a noise filter in the noise shaper.

As shown in FIG. 3, if the frequency characteristic of the noise filter 11 is selected such that the amplitude characteristic of the audio frequency band is suppressed while the same characteristic of the frequency band above the audio frequency band is emphasized accordingly, quantization noise in the audio frequency band of the digital signal D3 from the noise shaper 7 can be suppressed.

That is, in the digital audio tape recorder 1, quantization noise can be driven to a band above the audio frequency band, thus the quantization noise can be distributed above the upper limit frequency of the audio frequency band.

According to the above, quantization noise during requantization can be reduced aurally.

Therefore, in the digital audio tape recorder 1, aural resolution exceeding the number of bits recordable within the audio frequency band can be obtained, compared to the method in which audio signal S1 input is simply converted into digital audio signal with a sampling frequency of 2 fs as well as 16 bits per sample and recorded by the recorder unit 2.

Thereby, the digital audio tape recorder 1 records and/or reproduces an audio signal with a high tone quality, by using the characteristic of the recorder unit 2 capable of recording and reproducing the frequency band double the audio frequency band.

Figure 4:
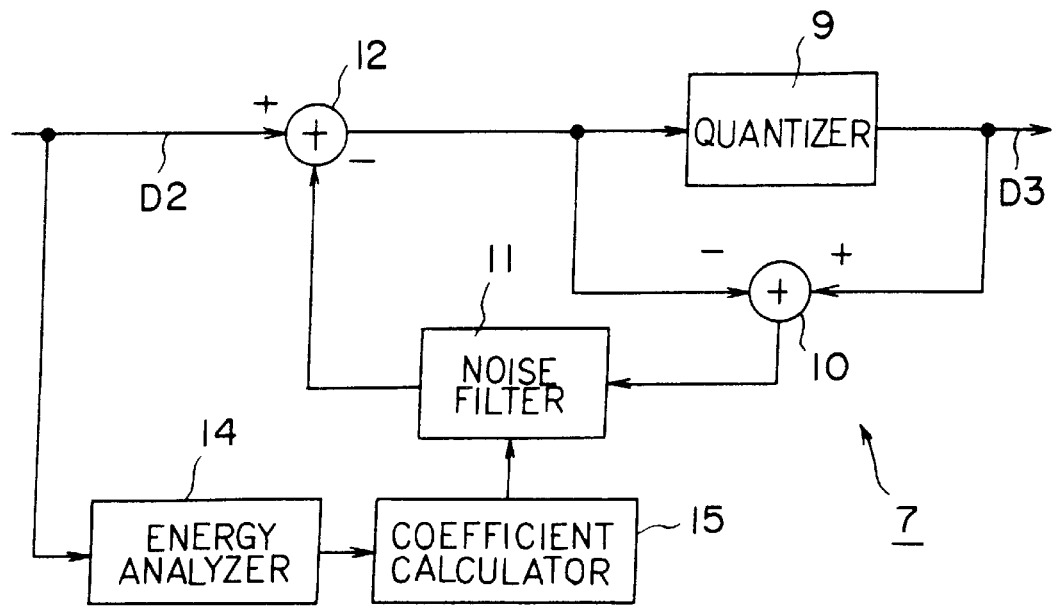
FIG. 4 is a block diagram showing the specific constitution of the noise shaper.

Further, in the first embodiment, as shown in FIG. 4, the noise shaper 7 is composed to reduce aural noise by using of an adaptive predictive coding method.

That is, the noise shaper 7 supplies the input digital signal D2 to the subtracting circuit 12, and also supplies it to an energy analyzer 14, to cumulatively add the input digital signal D2 using a specified time window function, thereby, the frequency distribution of the digital signal D2 is detected.

Based on the detected results of the energy analyzer 14, a coefficient calculator 15 switches the characteristic of the noise filter 11 to correspond to the frequency characteristic of the input digital signal D2, so that quantization noise in the digital signal D3 to be output can be reduced and driven to above the audio frequency band.

Figure 5:
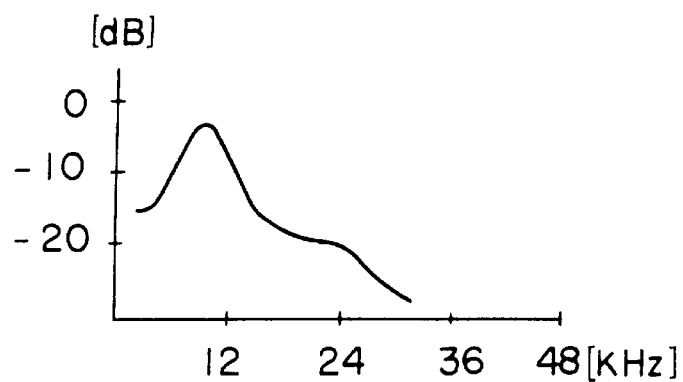
FIG. 5 is a characteristic curve diagram illustrating a case in which the energy of the input signal concentrates in a low frequency band.
Figure 6:
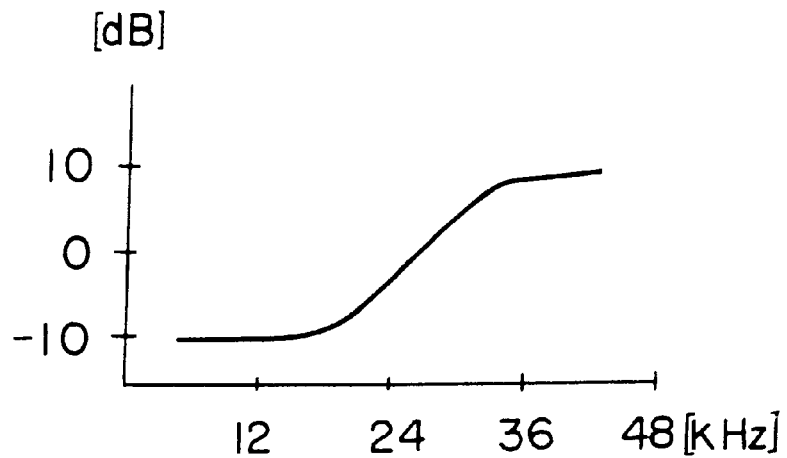
FIG. 6 is a characteristic curve diagram illustrating the frequency characteristic of the filter in the case of an input characteristic in FIG. 5.

As shown in FIG. 5, if the energy of the digital signal D2 of input signal concentrates in a low frequency band, a coefficient calculator 15 sets the coefficient of the noise filter 11 to reduce quantization noise in the low frequency band as shown in FIG. 6. Thereby, quantization noise in the digital signal D3 to be output from the noise shaper 7 is reduced, and quantization noise is distributed above the audio frequency band.

Figure 7:
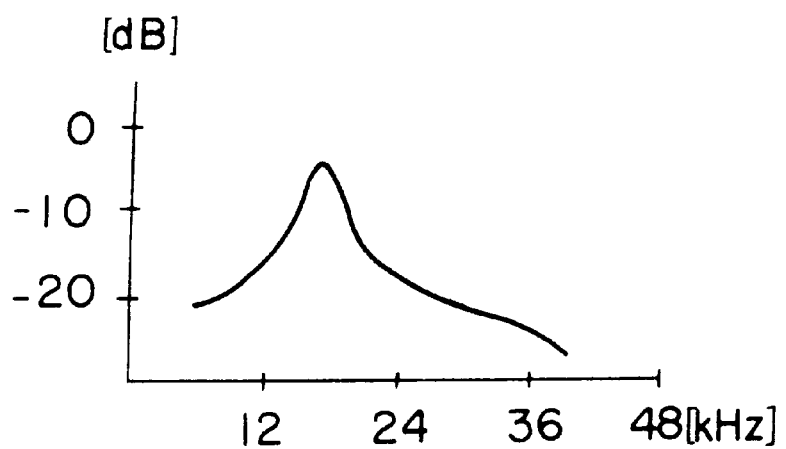
FIG. 7 is a characteristic curve diagram illustrating a case in which the energy of the input signal is concentrated in a high frequency band.
Figure 8:
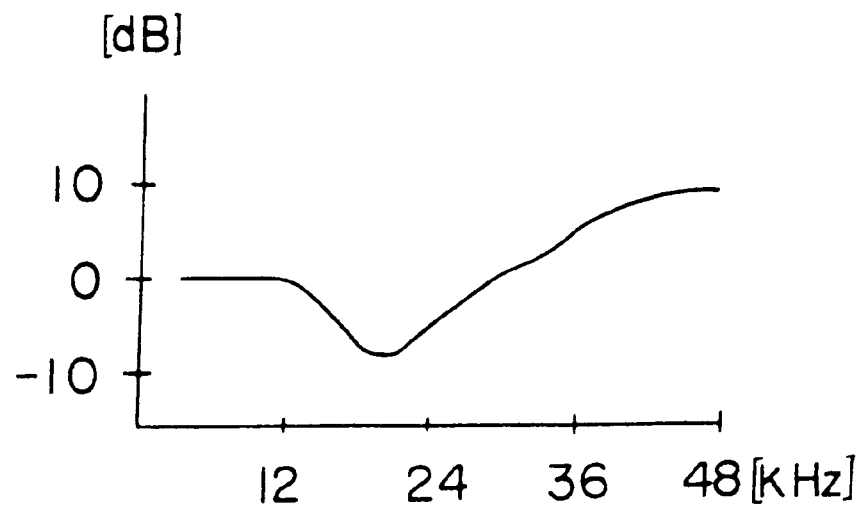
FIG. 8 is a characteristic curve diagram illustrating the frequency characteristic of the filter in the case of an input characteristics as in FIG. 7.

On the other hand, if energy is concentrated in a high frequency band as shown in FIG. 7, the coefficient calculator 15 sets the coefficient of the noise filter 11 to reduce quantization noise in the middle and high frequency bands. Thereby, quantization noise in the digital signal D3 to be output is reduced, and the quantization noise is distributed above the audio frequency band.

The recorder unit 2 sets the rotation speed of the rotary drum and the running speed of the magnetic tape to a value double the speed of a normal digital audio tape recorder, and also sets the overall signal processing speed to a value double the speed of a normal digital audio tape recorder. The recorder unit 2 sequentially records the digital signal D3 of 16-bit with a sampling frequency of 96 [kHz] which is output from the noise shaper 7.

In reproducing, the recorder unit 2 operates at the same speed as in recording, and processes the reproducing signal output sequentially from the magnetic head to output digital signal D4 of 16-bit with a sampling frequency of 96 [kHz].

An oversampling filter 17 limits the frequency band of the digital signal D4 before output, and a digital-to-analog (hereinafter, referred to as "D/A") converting circuit 18 converts digital signal output from the filter 17 into analog signal and output it.

The digital audio tape recorder 1 outputs an analog signal output from the D/A converting circuit 18 via a low-pass filter (LPF) 19, to reproduce the audio signal S2. In this case, the audio signal S2 in which quantization noise is suppressed in the audio frequency band and reduced by means of an adaptive predictive coding method. As a result, in the digital audio tape recorder 1, tone quality can be improved compared to the method of simply using the double-speed digital audio tape recorder to record and reproduce audio signal.

This description applies to a noise shaping method to requantize an audio signal in such a way that quantization noise is distributed above the audio frequency band, and at the same time, applies to an adaptive predictive coding method to reduce noise. Consequently, a resolution exceeding the number of bits which can be recorded within the audio frequency band is obtained compared to the method of simply using the digital audio tape recorder to record and reproduce an audio signal with a sampling frequency of 2 fs as well as 16 bits per sample. Thereby, the digital tape recorder 1 can record and reproduce an audio signal with a high tone quality by using effectively the characteristic of the double-speed digital audio tape recorder 2.

Figure 9:
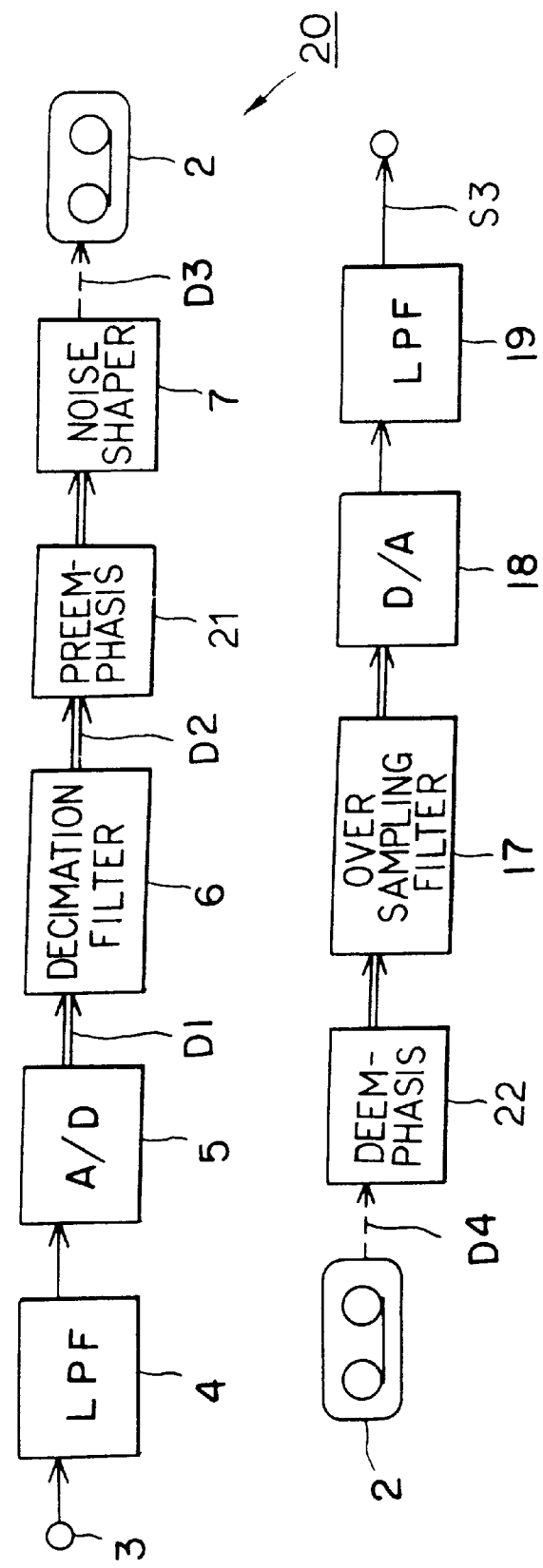
FIG. 9 is a block diagram showing a digital audio tape recorder according to a second embodiment of this invention.

Next, a second embodiment of this invention will be described with reference to FIGS. 9 to 11. In FIG. 9, the part corresponding to FIG. 1 are denoted with the same numerals as in FIG. 1, and the detailed description is therefore omitted.

In FIG. 9, a reference numeral 20 denotes a digital audio tape recorder according to the second embodiment. In the digital audio tape recorder 20, preemphasis and deemphasis circuits are used to further improve tone quality.

In the digital audio tape recorder 20, a preemphasis circuit 21 is provided between a decimation filter 6 and the noise shaper 7, and a deemphasis circuit 22 is provided between the recorder unit 2 and the oversampling filter 17.

Figure 10:
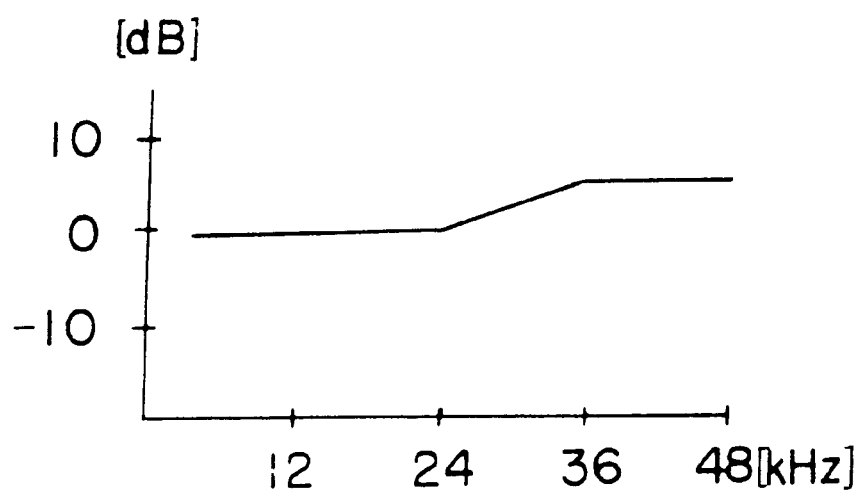
FIG. 10 is a characteristic curve diagram illustrating the frequency characteristic of a preemphasis circuit.
Figure 11:
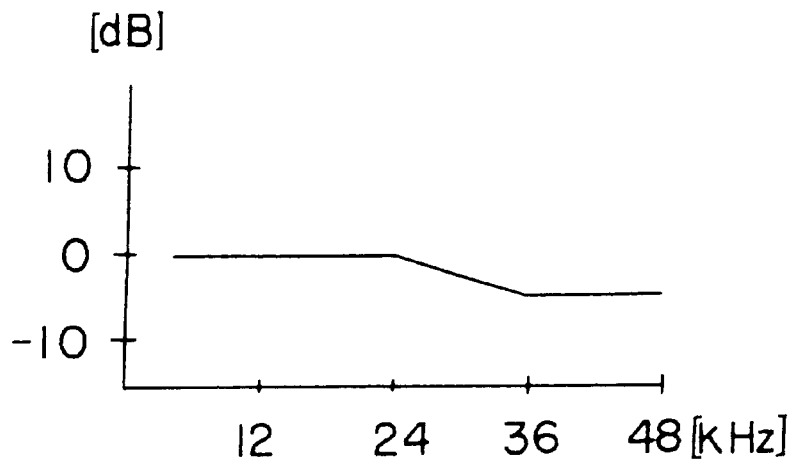
FIG. 11 is a characteristic curve diagram illustrating the frequency characteristic of a deemphasis circuit.

In the preemphasis circuit 21, as shown in FIG. 10, the frequency amplification characteristic is selected to emphasize the frequency band above the audio frequency band. In the deemphasis circuit 22, as shown in FIG. 11, the frequency amplification characteristic is selected to complement the frequency characteristic of the preemphasis circuit 21.

That is, if the frequency characteristic of the preemphasis circuit 21 is selected to emphasize the frequency band above the audio frequency band as in the noise filter 11 shown in FIG. 2, aural resolution exceeding the number of bits which can be recorded within the recordable and/or reproducible frequency band of the recorder unit 2 can be obtained.

Thereby, an audio signal with a higher tone quality can be recorded and/or reproduced.

Further, the digital audio tape recorder according to a third embodiment of this invention will be described with reference to FIGS. 12 to 15. Note that, the parts common to the first embodiment have the same numerals, and thus the detailed description is omitted.

In the digital audio tape recorders 1 and 20 which are shown in the first and second embodiments, when the reproduced audio data of which the form of the digital signal are output toward the other digital equipments, if the digital signal D4 output from the recorder unit 2 is output, it cannot be applied to a digital audio interface compatible with such digital equipment, for example, digital equipment with the sampling frequency fs and 20 bits per sample.

Therefore, the digital audio tape recorder 30 of the third embodiment converts the digital signal D4 with the sampling frequency 2 fs and 16 bits per sample into digital signal D6 with the sampling frequency fs and 20 bits per sample which meets the standard for a digital audio interface, then outputs the converted signal.

When converting the signal as described above, as shown in FIG. 12, the digital audio tape recorder 30 uses a digital filter 31 to limit the band of the digital signal D4, then reduces the sampling frequency fs by using a decimation filter 32. Thereby, in the recorder 30, the digital signal D4 can be converted into the digital signal D6 without degrading the quality of the digital signal D4.

The digital filter 31 receives the digital signal D4 with the sampling frequency 2 fs and 16 bits per sample which is output from the recorder unit 2. The digital filter 31 limits the frequency band of the digital signal D4 to a frequency of 24 [kHz], which is within the audio frequency band, by sequentially performing convolution operations for continuous audio data.

In this case, the digital filter 31 outputs the higher 20 bits of the result of the convolution operation to succeeding a decimation filter 32.

Figure 13:
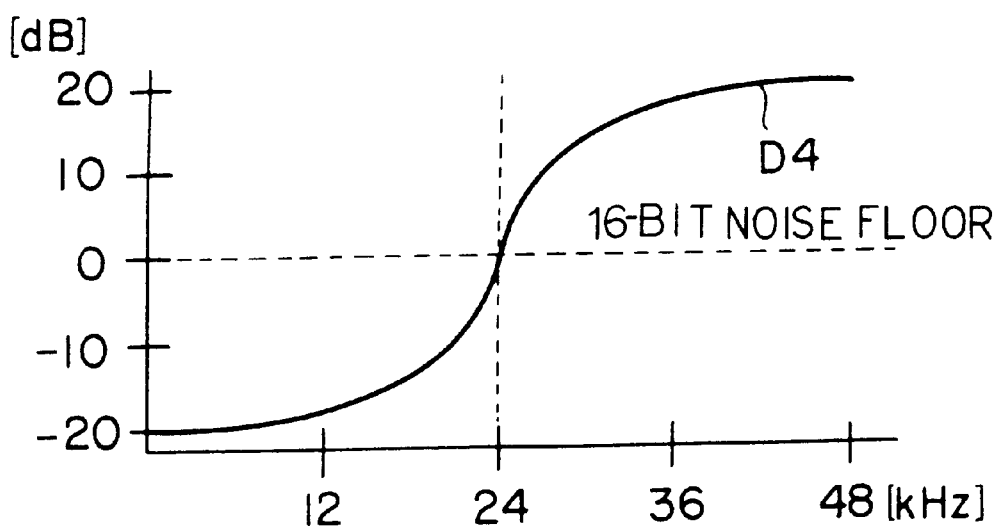
FIG. 13 is a characteristic curve diagram explaining a digital signal output from the digital audio tape recorder according to the third embodiment.
Figure 12:
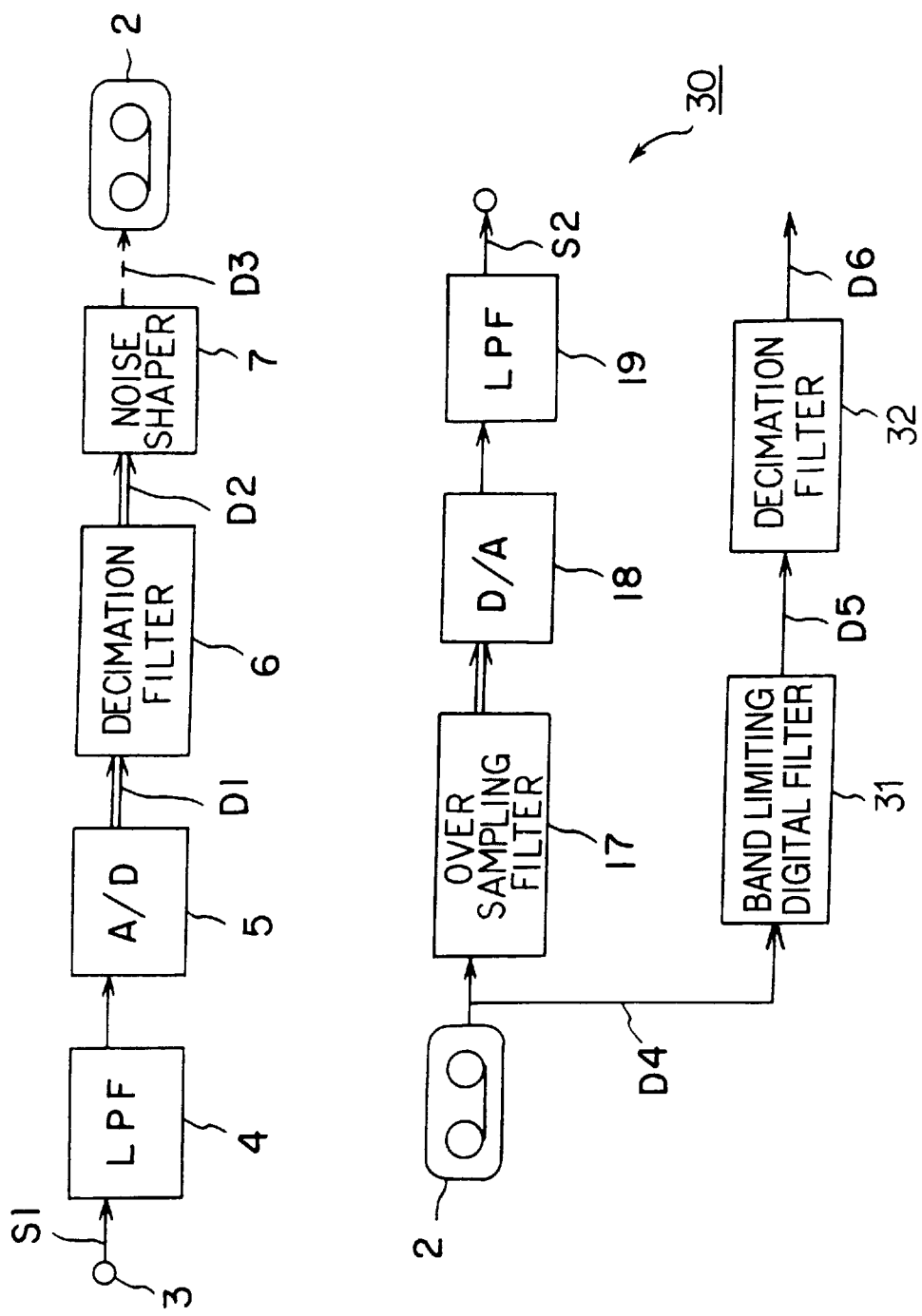
FIG. 12 is a block diagram illustrating a digital audio tape recorder according to a third embodiment of this invention.
Figure 14:
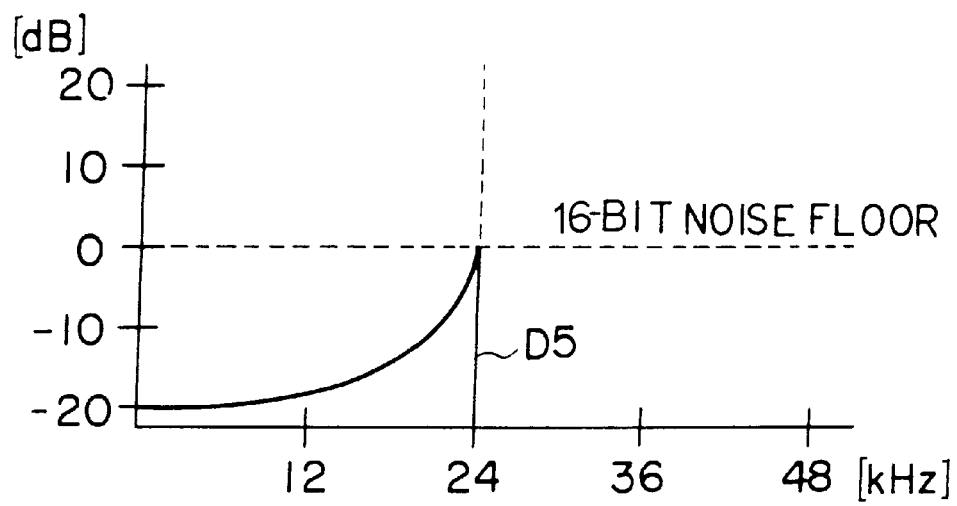
FIG. 14 is a characteristic curve diagram explaining the operation of the digital filter.

The digital signal D4 with quantizing noise distributed above the audio frequency band as shown in FIG. 13, is supplied to the succeeding decimation filter 32 after noise above the frequency of 24 [kHz] is suppressed as shown in FIG. 14.

The decimation filter 32 selectively outputs the digital signal D5 output from the digital filter 31 so that the digital signal D5 is converted into a digital signal D6 with a sampling frequency of 48 [kHz] and 20 bits per sample, which is compatible with the digital audio interface.

Figure 15:
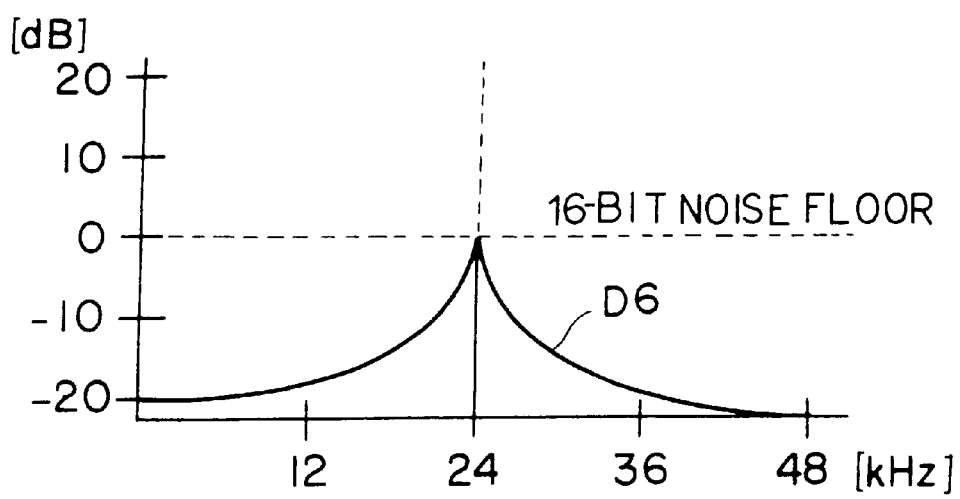
FIG. 15 is a characteristic curve diagram explaining the operation of the decimation filter.

The digital signal D6 becomes the signal that the quantizing noise folded from the frequency of 48 [kHz] as shown in FIG. 15, and the noise shaping effect can be maintained within the audio frequency band because the digital filter 31 limits the band previously.

On the other hand, if the digital signal D4 output from the recorder unit 2 is simply converted into an audio signal with a sampling frequency of 48 [kHz], even quantizing noise distributed outside the audio frequency band of the digital signal D4 is mixed in the audio frequency band as folding noise.

That is, in recording, the quantizing noise shaped and driven out from the audio frequency band is mixed in the audio frequency band, so that no noise shaping effect is provided in audio data transmitted via the digital audio interface.

According to the third embodiment, the digital signal D6 can be transmitted via the digital audio interface with the noise shaping effect maintained, if it is converted into audio signal with a sampling frequency of 48 [kHz] after its frequency band is limited to the audio frequency band. As a result, when audio signal with high quality is transmitted using a transmission path with a good frequency characteristic, the audio signal transmitted can be delivered in real time without degrading its quality.

Therefore, even digital signal data D6 transmitted via the digital audio interface can provide aural resolution exceeding 16 bits required for recording and reproducing for the recorder unit 2.

According to the third embodiment described above, when audio data is reproduced after it is requantized and recorded by applying a noise shaping method such that quantizing noise can be distributed above the audio frequency band, reproduced data is limited to the band within the audio frequency band, and then converted into the sampling frequency of the digital audio interface. Thereby, according to the third embodiment, the audio data can be delivered with the noise shaping effect maintained, so that reproduced audio data can be delivered in real time without degrading its quality.

In each embodiment described above, a time window function is used to detect the energy distribution of the digital signal D2. However, this invention is not only limited to this, but is widely applicable to different energy distribution detection methods, such as frequency band-division of the digital signal D2 for the detection of energy distribution or the application of fast Fourier transformation.

Further, in each embodiment described above, an adaptive predictive coding method is used not only noise shaping, and an audio signal is preemphasized before recording. However, this invention is not only limited to this, but may also use only noise shaping as needed, or may combine a method of predictive encoding and, any of methods of preemphasis, with the noise shaping.

Furthermore, in each embodiment described above, this invention is applied to a digital audio tape recorder to record and/or reproduce a digital audio signal. However, this invention is not only limited to this, but is widely applicable to the recording and/or reproducing of digital audio signal via a recording medium such as an optical disc, or the transmission of audio signal via any transmission path other than such a recording medium.

While there has been described in connection with the preferred embodiments of the invention, it will be obvious to those skilled in the art that various changes and modifications may be made, therefore, the appended claims are intended to cover all such changes and modifications as fall within the true spirit and scope of the invention.

What is claimed is:

1. An audio signal transmitting apparatus for transmitting a digital audio signal via a transmitting path which is constructed such that a digital signal having a predetermined number of bits per sample is transmitted with a predetermined sampling frequency, comprising:
   analog-to-digital converting means for converting an input analog signal into an analog to digital output digital signal having a sampling frequency higher than an audio frequency band;
   filter means for reducing the sampling frequency of the analog to digital output digital signal from said analog-to-digital converting means, and then converting the analog to digital output digital signal into an m-bits per sample digital signal; and
   noise shaping means for reducing the number of bits of the m-bits per sample digital signal from said filter means from m-bits per sample to n-bits per sample, suppressing requantization noise in the audio-frequency band caused by requantizing, and supplying the digital audio signal to said transmitting path, the noise shaping means comprising a detecting means for detecting an energy distribution of the m-bits per sample digital signal output by said filter means, and for switching a feedback frequency characteristic of the noise shaping means in correspondence to a detected result from said detecting means.

2. An audio signal transmitting apparatus according to claim 1, wherein said noise shaping means further comprises a noise filter such that a frequency characteristic of the noise filter is switched based on the detected result of said detecting means.

3. The apparatus of claim 2, wherein said apparatus further comprises:
   a digital emphasis means having an emphasis frequency amplitude characteristic in which frequencies higher than the audio-frequency band of the m-bits per sample digital signal from said filter means are emphasized; and
   a digital deemphasis means having a deemphasis frequency amplitude characteristic which supplements the emphasis frequency amplitude characteristic of the digital audio signal output via said transmitting path.

4. The apparatus of claim 3, said apparatus further comprising:
   a digital filter for band-limiting said digital audio signal transmitted via said transmitting path at the audio-frequency band; and
   a sampling frequency converting circuit for converting a digital filter output signal from said digital filter into a digital audio interface signal having a sampling frequency which is less than the predetermined sampling frequency and outputting the digital audio interface signal.

5. The apparatus of claim 2, said apparatus further comprising:
   a digital filter for band-limiting said digital audio signal transmitted via said transmitting path at the audio-frequency band; and
   a sampling frequency converting circuit for converting a digital filter output signal from said digital filter into a digital audio interface signal having a sampling frequency which is less than the predetermined sampling frequency and outputting the digital audio interface signal.

6. The apparatus of claim 1, wherein said apparatus further comprises:
   a digital emphasis means having an emphasis frequency amplitude characteristic in which frequencies higher than the audio-frequency band of the m-bits per sample digital signal from said filter means are emphasized; and
   a digital deemphasis means having a deemphasis frequency amplitude characteristic which supplements the emphasis frequency amplitude characteristic of the digital audio signal output via said transmitting path.

7. The apparatus of claim 1, said apparatus further comprising:
   a digital filter for band-limiting said digital audio signal transmitted via said transmitting path at the audio-frequency band; and
   a sampling frequency converting circuit for converting a digital filter output signal from said digital filter into a digital audio interface signal having a sampling frequency which is less than the predetermined sampling frequency and outputting the digital audio interface signal.

8. The apparatus of claim 6, said apparatus further comprising:

a digital filter for band-limiting said digital audio signal transmitted via said transmitting path at the audio-frequency band; and a sampling frequency converting circuit for converting a digital filter output signal from said digital filter into a digital audio interface signal having a sampling frequency which is less than the predetermined sampling frequency and outputting the digital audio interface signal.

9. An audio signal transmitting method for transmitting a digital audio signal via a transmitting path which is constructed such that a transmitting digital signal having a predetermined number of bits per sample is transmitted, with a predetermined sampling frequency being a sampling frequency which is sufficient to characterize said transmitting digital signal occupying a frequency band higher than an audio frequency band, said transmitting method comprising the steps of:

requantizing the digital audio signal which has said predetermined sampling frequency and larger number of bits per sample than said predetermined number of bits, so as to generate said transmitting digital signal, and then transmitting the transmitting digital signal via said transmitting path;

noise shaping said digital audio signal in requantizing, so as to suppress the requantization noise within the audio frequency band; and detecting an energy Distribution of said digital audio signal, in order to switch a feedback frequency characteristic of said noise shaping based on an energy distribution detection result.

10. The method of claim 9, said method further comprising the step of:

emphasizing a frequency band higher than the audio frequency band of said transmitting digital signal using a digital preemphasis circuit and recording an emphasized digital signal on a recording medium, when transmitting said transmitting digital signal via said transmitting path, and when reproducing said transmitting digital signal recorded on said recording medium, outputting the emphasized digital signal using a digital deemphasis circuit.

11. the method of claim 10, wherein said transmitting path is a magnetic recording and/or reproducing apparatus for recording said transmitting digital signal with said predetermined sampling frequency having said predetermined number of bits per sample on a magnetic tape, and said predetermined sampling frequency is suitable to characterize a signal occupying twice said audio frequency band.

12. The method of claim 10 further including the steps of:

band-limiting of said transmitting digital signal transmitted via said transmitting path within audio frequency band by digital filter, and outputting it; and converting the digital signal output from said digital filter into a predetermined sampling frequency by a sampling frequency converting circuit, and outputting it.

13. The method of claim 12, wherein said transmitting path is a magnetic recording and/or reproducing apparatus for recording and/or reproducing said transmitting digital signal on a magnetic tape, a sampling frequency of said transmitting path can record and/or reproduce frequency band double said audio frequency band, and said sampling frequency converting circuit converts said digital signal output from said digital filter into a half sampling frequency of said transmitting path, and then outputs it.

14. The method of claim 10, wherein said transmitting path is a magnetic recording and/or reproducing apparatus for recording and/or reproducing said transmitting digital signal on a magnetic tape, a sampling frequency of said transmitting path can record and/or reproduce frequency band double said audio frequency band, and said sampling frequency converting circuit converts said digital signal output from said digital filter into a half sampling frequency of said transmitting path, and then outputs it.

15. the method of claim 9, wherein said transmitting path is a magnetic recording and/or reproducing apparatus for recording said transmitting digital signal with said predetermined sampling frequency having said predetermined number of bits per sample on a magnetic tape, and said predetermined sampling frequency is suitable to characterize a signal occupying twice said audio frequency band.

16. The method of claim 9 further including the steps of:

band-limiting of said transmitting digital signal transmitted via said transmitting path within audio frequency band by digital filter, and outputting it; and converting the digital signal output from said digital filter into a predetermined sampling frequency by a sampling frequency converting circuit, and outputting it.

17. The method of claim 16, wherein said transmitting path is a magnetic recording and/or reproducing apparatus for recording and/or reproducing said transmitting digital signal on a magnetic tape, a sampling frequency of said transmitting path can record and/or reproduce frequency band double said audio frequency band, and said sampling frequency converting circuit converts said digital signal output from said digital filter into a half sampling frequency of said transmitting path, and then outputs it.

18. The method of claim 9, wherein said transmitting path is a magnetic recording and/or reproducing apparatus for recording and/or reproducing said transmitting digital signal on a magnetic tape, a sampling frequency of said transmitting path can record and/or reproduce frequency band double said audio frequency band, and said sampling frequency converting circuit converts said digital signal output from said digital filter into a half sampling frequency of said transmitting path, and then outputs it.

19. A recording and/or reproducing apparatus for recording and/or reproducing a digital audio signal on/from a recording medium, said apparatus comprising:

a recording and/or reproducing unit for recording and/or reproducing a signal at a speed double a normal moving speed of a head relative to the recording medium;

an analog-to-digital convertor for converting an input analog audio signal into an analog to digital output signal, which occupies a frequency band higher than an audio frequency band, and has a sampling frequency selected to be sufficiently higher than a maximum frequency at which said recording and/or reproducing unit is capable of recording;

a filter for reducing the sampling frequency of the analog to digital output signal from said analog-to-digital convertor, and converting the analog to digital output signal into a digital filter output signal having m-bits per sample (m>n); and a noise shaper for converting the digital filter output signal from said filter into a noise shaper digital output signal reduced from m-bits per sample to n-bits per sample, and in requantizing, noise shaping the noise shaper digital output signal so as to suppress quantization noise within the audio frequency band and supplying the noise shaper digital output signal to said recording and/or reproducing unit, the noise shaper including a detecting means for detecting an energy distribution of the analog to digital output signal from said filter, and switching a feedback frequency characteristic of noise shaping based on an energy distribution detection result from said detecting means.

20. The recording and/or reproducing apparatus according to claim 19, wherein said noise shaper further comprises a noise filter that switches its frequency characteristic based on an energy distribution detection output signal from said detecting means.

21. The apparatus of claim 20, further including:

a digital emphasis circuit having a frequency amplitude characteristic for emphasizing frequencies higher than the audio frequency band of the digital output signal having m-bits per sample from said filter; and a digital deemphasis circuit having a frequency amplitude characteristic for supplementing the frequency characteristic of said emphasis circuit of a digital recording medium signal output from said recording and/or reproducing unit which has been read from said recording medium.

22. The apparatus of claim 21, further including:

a digital filter for band-limiting the digital recording medium signal output from said recording and/or reproducing unit within the audio frequency band, and outputting a digital filter output, and a sampling frequency converting circuit for converting the digital filter output from said digital filter into a predetermined sampling frequency and outputting a converting circuit output.

23. The apparatus of claim 20, further including:

a digital filter for band-limiting the digital recording medium signal output from said recording and/or reproducing unit within the audio frequency band, and outputting a digital filter output, and a sampling frequency converting circuit for converting the digital filter output from said digital filter into a predetermined sampling frequency and outputting a converting circuit output.

24. The apparatus of claim 19, further including:

a digital emphasis circuit having a frequency amplitude characteristic for emphasizing frequencies higher than the audio frequency band of the digital output signal having m-bits per sample from said filter; and a digital deemphasis circuit having a frequency amplitude characteristic for supplementing the frequency characteristic of said emphasis circuit of a digital recording medium signal output from said recording and/or reproducing unit which has been read from said recording medium.

25. The apparatus of claim 24, further including:

a digital filter for band-limiting the digital recording medium signal output from said recording and/or reproducing unit within the audio frequency band, and outputting a digital filter output, and a sampling frequency converting circuit for converting the digital filter output from said digital filter into a predetermined sampling frequency and outputting a converting circuit output.

26. The apparatus of claim 19, further including:

a digital filter for band-limiting the digital recording medium signal output from said recording and/or reproducing unit within the audio frequency band, and outputting a digital filter output, and a sampling frequency converting circuit for converting the digital filter output from said digital filter into a predetermined sampling frequency and outputting a converting circuit output.

* * * * *